United States Patent Office 3,492,121
Patented Jan. 27, 1970

3,492,121

GRAVURE ETCH RESIST FILM

Edward C. Yackel, Rochester, N.Y., assignor to Eastman Kodak Company, Rochester, N.Y., a corporation of New Jersey No Drawing. Filed May 10, 1967, Ser. No. 637,342
Int. Cl. G03c *1/90*
U.S. Cl. 96—83 12 Claims

ABSTRACT OF THE DISCLOSURE

A stripping layer comprising cellulose acetate N,N-dialkylaminoacetate (CADA) and gelatin for gravure etch resist film. This stripping layer permits easy removal of the temporary support from the photosensitive emulsion and may be removed from the emulsion with warm water after wet transfer and stripping. The stripping layer shows good adhension during processing and may be even more easily removed from the emulsion if the surface of the CADA layer is treated with dilute aqueous acid after the temporary support has been stripped away.

This invention concerns a gravure etch resist film comprising a mixture of cellulose acetate N,N-dialkylaminoacetate and gelatin on a support and having thereover a photographic emulsion.

Various light-sensitive elements have been proposed for the preparation of etching resists for photogravure platemaking. These elements have included the use of a cellulose ester film base and a stripping layer adjacent to the layer containing a sensitized gelatin coating.

After exposure of the photosensitive emulsion, the element is developed, fixed, washed and dried. This procedure differentially affects the gelatin of the emulsion layer imparting a hardening and insolubilizing effect to the gelatin around the silver grains of the image.

The resulting gravure resist film is rolled with its emulsion side down onto the wetted surface of a copper gravure cylinder. Thereafter, the film base support is gently peeled away leaving the emulsion adhering to the gravure cylinder or plate.

The stripping layer remains adherent to the upper surface of a gelatin relief that was formed by processing the sensitized gelatin coating. After the gelatin relief is applied to the copper surface to form a resist for subsequent etching, it is necessary to remove the stripping layer and the unhardened gelatin prior to the etching operation. The nature of the previously-employed stripping layers has ordinarily required that special precautions be taken to prevent the formation of stripping blisters on the emulsion layer when the support is peeled therefrom. In addition, special measures such as the use of organic solvents are usually necessary for the removal of the stripping layer from the photosensitive gelatin emulsion layer.

In accordance with this invention, gravure etch resist film is provided which contains a stripping layer that permits easy removal of the temporary support from the photo-sensitive emulsion layer after wet transfer and may be simply removed from the resist with warm water.

It has now been found that when a stripping layer comprising a mixture of cellulose acetate N,N-dialkylaminoacetate in which the alkyl group has from 1 to 4 carbon atoms (hereinafter referred to as CADA), and a proteinaceous substance such as gelatin are employed in a gravure etch resist film, desirable features are realized which features are not found in prior resist films. The stripping layer of this invention, which comprises CADA and gelatin, results in a gravure etch resist film which has good adhesion during processing and permits easy stripping of the temporary support. Moreover, the stripping layer may be easily removed during a wash-off operation with warm water.

Although the CADA layer may be removed with water at a temperature of 35° to 40° C., the ease of removal of the CADA layer may be further enhanced by swabbing this layer, after stripping away the temporary support, with any dilute aqueous acid, e.g., a three percent acetic acid solution. The dilute acid treatment solubilizes the CADA and enables it to be dissolved in the wash water.

In general, the etch resist film of this invention comprises the following layers in the order given:

(1) A dimensionally stable, temporary film support, which may optionally have a suitable subbing layer thereon;

(2) A stripping layer comprising a mixture of CADA and gelatin; and (3) A gelatin-containing photosensitive emulsion layer, which may contain a tanning development agent.

In addition, the etch resist film of this invention may include a thin layer of gelatin interposed between the CADA stripping layer and the gelatin-containing photosensitive layer. Alternatively, or in addition to the thin gelatin layer, an antihalation layer comprising gelatin and either an antihalation dye, Carey Lea silver filter layer or a coloring material, such as manganese dioxide, may be employed adjacent to the photosensitive emulsion layer.

The temporary film support may comprise a conventional film base such as cellulose acetate, cellulose acetate butyrate, cellulose triacetate, cellulose butyrate, polyvinylchloride, polystyrene, polyesters such as polyethylene terephthalate, polycarbonates and the like. The temporary support may suitably have a thickness on the order of from about 0.005 to about 0.15 inch.

The film support may be provided with a subbing layer such as a layer of cellulose nitrate, a terpolymer comprising vinylidene chloride, methylmethacrylate, and itaconic acid, and the like. However, in many instances the adhesion between the temporary support and the stripping layer is sufficient and the use of a subbing layer may be dispensed with.

CADA is an acid-soluble cellulose derivative, that may be prepared by the reaction of a dialkylamine such as for example dimethylamine, diethylamine dipropylamine or dibutylamine with cellulose acetate chloroacetate. While CADA is soluble in many organic solvents and in dilute aqueous acid solutions having a pH below about 5.4, it is insoluble in water. The preparation of cellulose acetate N,N-diethylaminoacetate is described in an article by G. D. Hiatt et al., in "Industrial and Engineering Chemistry, Products Research Development," volume 3, pages 295 to 299 (1964).

Aqueous acetic acid solutions of CADA and gelatin are compatible in practically all proportions. However, preferred mixtures of the CADA and gelatin comprise from about 20 to about 40 percent by weight gelatin and corresponding, from about 60 to about 80 percent by weight CADA (on a dry basis). When this mixture is coated onto the temporary film support, the resulting layer is substantially clear. The mixture of CADA and gelatin has the added advantage of having properties similar to gelatin so that it may be coated in a similar manner, i.e., chilled, set and dried.

The dry coverage of the CADA stripping layer may be of from about 0.1 to about 0.5 gram per square foot, preferably from about 0.2 to about 0.3 gram per square foot.

As previously mentioned, an antihalation layer may be interposed between the stripping laper and the photosensitive emulsion. The antihalation layer may contain Carey Lea silver, manganese dioxide or an antihalation dye such as one of the following:

(1) Congo Red;

(2) The product which results when 2-napthylamine-6,8-disulfonic acid is diazotized and coupled with an equimolar amount of chromotopic acid; and (3) The product (Schultz No. 208) which results when 1-naphthylamine-4-sulfonic acid is diazotized and coupled with an equimolar amount of 1-naphthol-4-sulfonic acid.

The antihalation layer may be suitably applied at a coverage of about 0.7 to about 0.8 gram per square foot, dry weight.

The photosensitive gelatin emulsion layer comprises silver halide and unhardened gelatin. A silver bromoiodide emulsion is quite suitable for this purpose. However, the various silver salts may be used as the sensitive salt including silver bromide, silver iodide, silver chloride, or mixed silver halides such as silver chlorobromide. The reason for the emulsion layer being in an unhardened condition is that in use of the element the gelatin of the silver halide emulsion layer is differentially hardened in the processing bath so that a tanned image is formed in the emulsion. Hardening of the gelatin in the emulsion layer would interfere with the use of the element in accordance with this invention.

In addition, the photosensitive emulsion may contain a tanning developing agent such as 4-phenyl catechol, 4-t-butyl catechol, etc., as described in U.S. Patent No. 3,146,-104 to Yackel et al. The tanning developing agent may suitably be employed in amounts of 30 to 60 mg. per square foot.

An anti-curl layer map be utilized as a backing for the photosensitive element of this invention, and such layer may be of a composition similar to the antihalation layer described above. This layer prevents the curling of the support due to the photosensitive emulsion on the opposite thereof, and is coated on the back of the temporary support layer. For example, the anti-curl layer may be a conventional gelatin pelloid containing either dyes or manganese dioxide. Other suitable anti-curl layers include a nitrocellulose lacquer, an alkyd resin coating or a lacquer including both nitrocellulose and alkyd resins. These coatings may be applied from a suitable solvent.

The various layers forming the photosensitive element of this invention including the CADA-gelatin stripping layer may be applied to the support by one of the well-known techniques such as hopper, scraper, bead coating, transfer by immersed rollers, or any of the other procedures well known in the art for the application of layers in preparing photographic products. The CADA is mixed with the gelatin in a form of an aqueous acidic solution, e.g., acetic acid solution.

The mixture of CADA and gelatin in the aqueous acid solution may additionally contain a coating aid, such as a lauryl or oleyl monoether of polyethylene glycol, etc. Additional materials which are suitable for this purpose are described in U.S. Patent No. 3,282,643 to Smith et al. The inclusion of such materials in the stripping layer, increases the ease of coating the temporary support with the CADA-containing stripping layer.

In addition, a suitable plasticizer, such as glycerin, 1,5 pentane diol, etc., may be incorporated in the stripping layer. Additional plasticizers which are suitable for this purpose are described in U.S. Patent No. 3,282,643.

Upon drying of the CADA stripping layer, a thin layer of gelatin and/or a gelatin-containing antihalation layer is coated upon the stripping layer. This gelatin coating may likewise contain the coating aids and plasticizers described above. Next, a photosensitive emulsion layer is coated upon the dried gelatin layer. The layers are applied in the order mentioned and may be applied simultaneously.

The film of this invention may be used in any of the several gravure processes. For example, the element in accordance with this invention may be subjected to short exposure while in effective contact with an image or any other type of element, such as the image modulated light beam from a photoelectric scanning device, which will impart a latent image to the silver halide photosensitive emulsion, as is well known in the photographic art.

After exposure, the exposed emulsion of the element is developed, fixed, washed and dried, which procedure differentially affects the gelatin of the emulsion layer imparting a hardening and insolubilizing effect to the gelatin around the silver grains of the image.

A suitable procedure for processing the film of this invention when a tanning developer is included in the silver-gelatin emulsion layer rather than in a separate processing bath is described hereinafter in Example 1.

It may be desirable to place the developed film in an acid stop bath prior to the fixing operation, particularly when a highly alkaline developer is employed. Such a treatment is particularly advantageous when a tanning developing agent is incorporated into the photosensitive silver halide emulsion layer. However, such a bath may be only employed if a salt is added to the stop bath to prevent the CADA stripping layer from becoming soft and frilling. A suitable stop bath comprises seven percent by weight sodium chloride added to a five percent acetic acid solution.

After exposure and processing, the film is applied to the moist surface of a gravure cylinder with the emulsion surface in contact with the copper cylinder. Following the stripping of the temporary support from the photosensitive layer, the CADA stripping layer along with the unhardened gelatin may be easily removed from the emulsion layer by merely treating with warm water, e.g., at a temperature of 35° to 45° C. The ease of removal of the CADA stripping layer is increased by "swabbing" the surface of this layer with dilute aqueous acid. A three percent solution of acetic acid is suitable for this purpose. As mentioned previously, the CADA is solubilized by this treatment and will dissolve in the wash water.

The formation of the etched surface on the copper cylinder may be accomplished in any conventional manner. For example, the copper cylinder containing the relief image may be etched as follows: some sort of protection such as asphaltum may be applied to the areas of the copper which are unprotected by the image and are not to be etched. The copper may be then subjected to an etching operation in which the copper is etched inversely to the thickness and hardness of the gelatin which resides on the surface of the copper. There results relief images adapted for use in photogravure printing operations.

The invention will be illustrated by the following Examples, but it is to be understood that the invention is not restricted thereto. The percentages are by weight unless otherwise specified.

EXAMPLE 1

An unsubbed, temporary cellulose acetate film base is coated with a cellulose acetate N,N-diethylaminoacetate. The mixture comprises 20 grams of a 10 weight percent cellulose acetate N,N-diethylaminoacetate acetic acid salt solution, 10 grams of a 10 weight percent aqueous solution of bone gelatin, 0.5 milliliters of a 50 weight percent glycerin solution, and 7 milliliters of a 15.34 percent by weight saponin solution. The coating has a thickness (wet) of 0.0004 inch.

The cellulose acetate N,N-diethylaminoacetate-gelatin stripping layer is dried and overcoated with a solution comprising 100 milliliters of a five percent by weight aqueous gelatin solution, two milliliters of a 50 percent glycerin solution and two milliliters of a 15.34 percent by weight saponin solution. The gelatin layer has a thickness of 0.004 inch when measured wet.

Upon drying, the gelatin layer is, in turn, overcoated with an etch resist unhardened photosensitive silver halide gelatin emulsion layer which contains a tanning developing agent, i.e., 4-phenyl catechol.

The dried photosensitive film is exposed to a positive, with a tungsten light source, following which it is activated for 45 seconds in a solution comprising 75 grams of sodium carbonate, five grams of sodium hydroxide, and two grams of potassium bromide with sufficient water to make one liter. Next, the film is rinsed for 10 seconds in cold tap water.

Fixing is conducted for a period of two minutes in a standard fixing solution as follows:

| | |
|---|---|
| Water ml | 500 |
| Sodium thiosulfate·$5H_2O$ g | 240 |
| Sodium sulfite anhydrous g | 10 |
| Sodium bisulfite g | 25 |
| Water to make 1 liter. | |

and is washed for 20 minutes in tap water. The film is then soaked for one minute in a five percent by weight glycerol and water solution and then dried.

The dried matrix is applied to a wetted copper cylinder and the temporary cellulose acetate base is stripped from the photosensitive emulsion over a period of 30 seconds to one minute. The cellulose acetate base strips easily without causing stripping blisters in the photosensitive emulsion.

The cellulose acetate N,N-diethylaminoacetate-gelatin layer swells in warm water and sluffs away and the soluble gelatin also washes off with warm water leaving a hardened gelatin resist image.

EXAMPLE 2

The procedure of Example 1 is repeated, except that subsequent to the stripping of the temporary cellulose acetate base from the photosensitive emulsion, the resulting cellulose acetate N,N-diethylaminoacetate stripping layer is swabbed with a three percent acetic acid solution. The resulting stripping layer is washed with warm water and is easily removed thereby.

EXAMPLE 3

Similar results are obtained when Examples 1 and 2 are repeated by substituting cellulose acetate N,N-dimethylaminoacetate, cellulose acetate N,N-dipropylaminoacetate, or cellulose acetate N,N - dibutylaminoacetate for cellulose acetate N,N-diethylaminoacetate.

The invention has been described in considerable detail with particular reference to certain embodiments thereof, but it is understood that modifications and variations can be effected within the spirit and scope of the invention as described hereinabove and as defined in the appended claims.

I claim:

1. A gravure resist film comprising a dimensionally stable, temporary film support containing thereon (1) a stripping layer comprising a mixture of cellulose acetate N,N-dialkylaminoacetate in which the alkyl group has 1–4 carbon atoms and gelatin; and (2) a light sensitive gelatin-silver halide photographic emulsion layer, in that order.

2. The film of claim 1 wherein a layer of gelatin is interposed between the stripping layer (1) and the photographic emulsion layer (2).

3. The film of claim 1 wherein a gelatin-containing antihalation layer is interposed between the stripping layer (1) and the photographic emulsion layer (2).

4. The film of claim 1 wherein the stripping layer comprises between about 20 and about 40 percent by weight gelatin and between about 60 and about 80 percent by weight cellulose acetate N,N-dialkylaminoacetate in which the alkyl group has 1–4 carbon atoms.

5. The film of claim 1 wherein the temporary film support comprises cellulose acetate.

6. The film of claim 1 wherein the stripping layer additionally comprises glycerin and saponin.

7. The film of claim 1 wherein the light sensitive gelatin-silver halide emulsion layer contains a tanning developing agent.

8. The film of claim 7 wherein the tanning developing agent is 4-phenyl catechol.

9. The film of claim 1 in which the stripping layer comprises cellulose acetate N,N-dimethylaminoacetate and gelatin.

10. The film of claim 1 in which the stripping layer comprises cellulose acetate N,N-diethylaminoacetate and gelatin.

11. The film of claim 1 in which the stripping layer comprises gelatin and cellulose acetate N,N-dipropylaminoacetate.

12. The film of claim 1 in which the stripping layer comprises gelatin and cellulose acetate N,N-dibutylaminoacetate.

References Cited

UNITED STATES PATENTS

| | | | |
|---|---|---|---|
| 2,328,034 | 8/1943 | Sease et al. | 96—83 |
| 2,363,764 | 11/1944 | White | 96—83 |
| 2,801,191 | 7/1957 | Nadeau et al. | 117—34 |
| 2,861,068 | 11/1958 | Mench et al. | 260—227 |
| 3,089,870 | 5/1963 | Mench et al. | 260—226 |

FOREIGN PATENTS

| | | |
|---|---|---|
| 537,232 | 6/1941 | Great Britain. |

RONALD H. SMITH, Primary Examiner